US012578540B2

(12) United States Patent
Sun et al.

(10) Patent No.: US 12,578,540 B2
(45) Date of Patent: Mar. 17, 2026

(54) PHOTOELECTRIC SIGNAL CONVERSION DEVICE

(71) Applicant: JESS-LINK PRODUCTS CO., LTD., New Taipei City (TW)

(72) Inventors: Chi-Hsien Sun, New Taipei City (TW); Ching-Hung Liu, New Taipei City (TW)

(73) Assignee: JESS-LINK PRODUCTS CO., LTD., New Tapei City (TW)

( * ) Notice: Subject to any disclaimer, the term of this patent is extended or adjusted under 35 U.S.C. 154(b) by 304 days.

(21) Appl. No.: 18/118,743

(22) Filed: Mar. 8, 2023

(65) Prior Publication Data

US 2024/0241331 A1     Jul. 18, 2024

(30) Foreign Application Priority Data

Jan. 13, 2023    (TW) ................................ 112101646

(51) Int. Cl.
*G02B 6/42*        (2006.01)
*H05K 7/20*        (2006.01)

(52) U.S. Cl.
CPC ......... *G02B 6/4269* (2013.01); *G02B 6/4261* (2013.01); *G02B 6/4278* (2013.01); *H05K 7/20409* (2013.01)

(58) Field of Classification Search
CPC ...... G02B 6/4269; G02B 6/4261; G02B 6/42; H05K 7/20409
See application file for complete search history.

(56) References Cited

U.S. PATENT DOCUMENTS 7,934,959 B2 *    5/2011  Rephaeli .............. G02B 6/4284
                                                      439/620.22
2011/0081807 A1    4/2011  Rephaeli et al.
                          (Continued)

FOREIGN PATENT DOCUMENTS

TW        M422178 U      2/2012
TW        M642414 U      6/2023

OTHER PUBLICATIONS

Office Action dated Oct. 13, 2023 of the corresponding Taiwan patent application No. 112101646.
(Continued)

*Primary Examiner* — Thomas A Hollweg
*Assistant Examiner* — Marc E Manheim
(74) *Attorney, Agent, or Firm* — HDLS IPR SERVICES; Chun-Ming Shih

(57)        ABSTRACT
A photoelectric signal conversion device includes an optical module (100), an adapter module (200), and a host (300). The optical module (100) includes a first electrical connection structure (110), a photoelectric signal conversion component (102), and an optical signal connection structure (120). The first electrical connection structure (110) and the optical signal connection structure (120) are connected to the photoelectric signal conversion component (102). The adapter module (200) arranged in the host (300) includes an insertion slot (201), a second electrical connection structure (220/220*a*), and a third electrical connection structure (230). The second electrical connection structure (220/220*a*) in the insertion slot (201) is electrically connected to the third electrical connection structure (230). The third electrical connection structure (230) is in the host (300) and coupled to the host (300). The insertion slot (201) is outside the host (300).

8 Claims, 9 Drawing Sheets

(56)        References Cited

U.S. PATENT DOCUMENTS

2013/0251052 A1* 9/2013 Tang ................. H04L 25/03878
                                                    375/259
2014/0127930 A1* 5/2014 Schmelz .......... H01R 13/62933
                                                    439/350
2017/0336583 A1* 11/2017 Chen ...................... H04B 10/50
2019/0044299 A1   2/2019 Kazav et al.
2019/0113698 A1   4/2019 Huang et al.
2021/0072473 A1* 3/2021 Wall, Jr. .................. H01L 23/42
2021/0389534 A1* 12/2021 Yu ...................... H05K 7/20336
2023/0161122 A1* 5/2023 Chen ................... G02B 6/4292
                                                    385/147

OTHER PUBLICATIONS

Search Report dated Sep. 6, 2023 of the corresponding European patent application No. 23161042.9.
Examination Report dated Oct. 22, 2025 of the corresponding European patent application No. 23161042.9.

* cited by examiner

200

PHOTOELECTRIC SIGNAL CONVERSION DEVICE

BACKGROUND OF THE DISCLOSURE

Technical Field

The present disclosure relates to an optical module, in particular to a photoelectric signal conversion device with an adapter module to facilitate heat dissipation of the optical module.

DESCRIPTION OF RELATED ART

In the related art, the optical module generally includes an optical signal interface, an electrical connector, and a photoelectric signal conversion circuit disposed between the optical signal interface and the electrical connector. When the optical module is directly plugged into a host, it is generally accommodated in the host and is electrically connected to the host through an electrical connector coupled to the host. The optical signal interface is exposed from a surface of the host for insertion of an optical signal line. Optical signals transmitted in the optical signal line are input into the photoelectric signal conversion circuit through the optical signal interface and converted into electrical signals, and the electrical signals are input into the host through the electrical connector. The photoelectric signal conversion circuit generates a lot of heat during operation, and the photoelectric signal conversion circuit is located in the host. However, this arrangement is unsatisfactory to heat dissipation.

In light of the above, the inventor of the present disclosure has devoted himself to doing research and studying scientific principles so as to solve the above problem of related art.

SUMMARY OF THE DISCLOSURE

The present disclosure provides a photoelectric signal conversion device with an adapter module to facilitate heat dissipation of an optical module.

The present disclosure provides a photoelectric signal conversion device, including: an optical module, an adapter module, and a host. The optical module includes a first electrical connection structure, a photoelectric signal conversion component, and an optical signal connection structure. The first electrical connection structure and the optical signal connection structure are connected to the photoelectric signal conversion component. The adapter module includes an insertion slot, a second electrical connection structure, and a third electrical connection structure. The second electrical connection structure is disposed in the insertion slot and electrically connected to the third electrical connection structure, and the third electrical connection structure is in the same configuration as the first electrical connection structure. The adapter module is disposed in the host. The third electrical connection structure is located inside the host and connected to the host, and the insertion slot is located outside the host. The optical module is inserted in the insertion slot to make the photoelectric signal conversion component be located outside the host, and the first electrical connection structure is coupled to the second electrical connection structure to make the photoelectric signal conversion component be electrically connected to the host.

According to one embodiment of the present disclosure, the adapter module includes an adapter circuit board, and the second electrical connection structure and the third electrical connection structure are connected to the adapter circuit board.

According to one embodiment of the present disclosure, the photoelectric signal conversion component of the optical module includes a signal conversion circuit board, and the first electrical connection structure and the photoelectric signal conversion component are arranged on the signal conversion circuit board. The first electrical connection structure includes a first tongue extended from the signal conversion circuit board and a plurality of first conductive points disposed on a surface of the first tongue. The third electrical connection structure includes a third tongue extended from the signal conversion circuit board and a plurality of third conductive points disposed on a surface of the third tongue, a structure of the third tongue is the same as a structure of the first tongue, and a layout of the third conductive points is the same as a layout of the conductive points.

According to one embodiment of the present disclosure, the second electrical connection structure includes two terminal blocks, the two terminal blocks are arranged on two sides of the adapter circuit board, the two terminal blocks protrude from an edge of the adapter circuit board, and the first electrical connection structure is inserted between the two terminal blocks.

According to one embodiment of the present disclosure, the optical signal connection structure is located outside the adapter module.

According to one embodiment of the present disclosure, the host includes a host housing, an opening is defined on the host housing, the host housing is provided with a fourth electrical connection structure, the adapter module is inserted in the host housing through the opening, the third electrical connection structure is coupled to the fourth electrical connection structure, and the insertion slot is located outside the host housing. The optical module includes a first module housing, a shape of the first module housing matches a shape of the insertion slot, the adapter module includes a second module housing, the second module housing includes a second coupling end and a third coupling end disposed opposite to the second coupling end, the second coupling end is located outside the host housing, and the insertion slot is defined in the second coupling end of the second module housing.

According to one embodiment of the present disclosure, a heat dissipation component is attached to an outer surface of the second coupling end of the second module housing.

In the photoelectric signal conversion device of the present disclosure, the optical module is electrically connected to the host through the adapter module, so that the optical module is located outside the host to facilitate heat dissipation of the photoelectric signal conversion component in the optical module.

DETAILED DESCRIPTION

Figure 1:
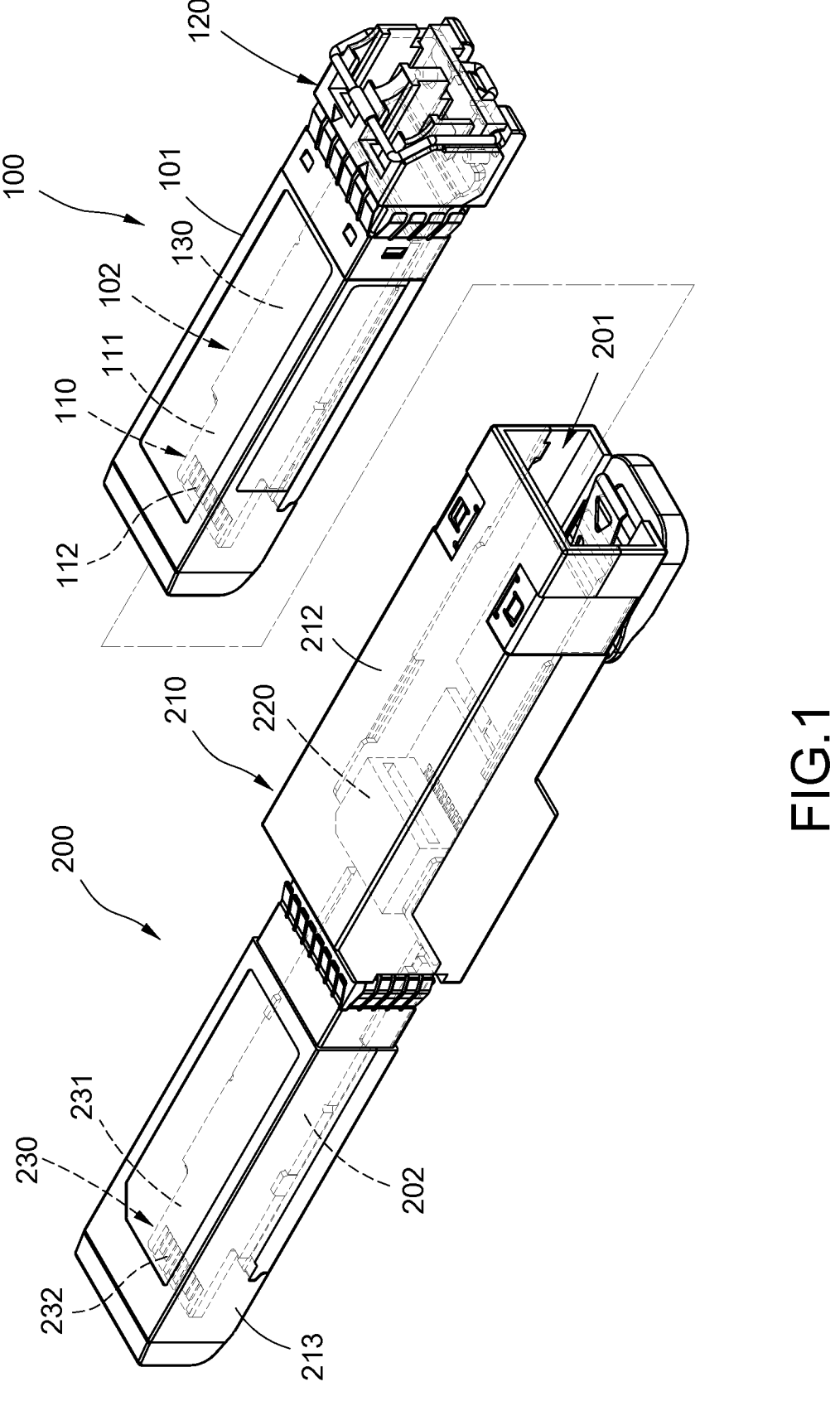
FIG. 1 is a perspective exploded view of a photoelectric signal conversion device according to one embodiment of the present disclosure.
Figure 2:
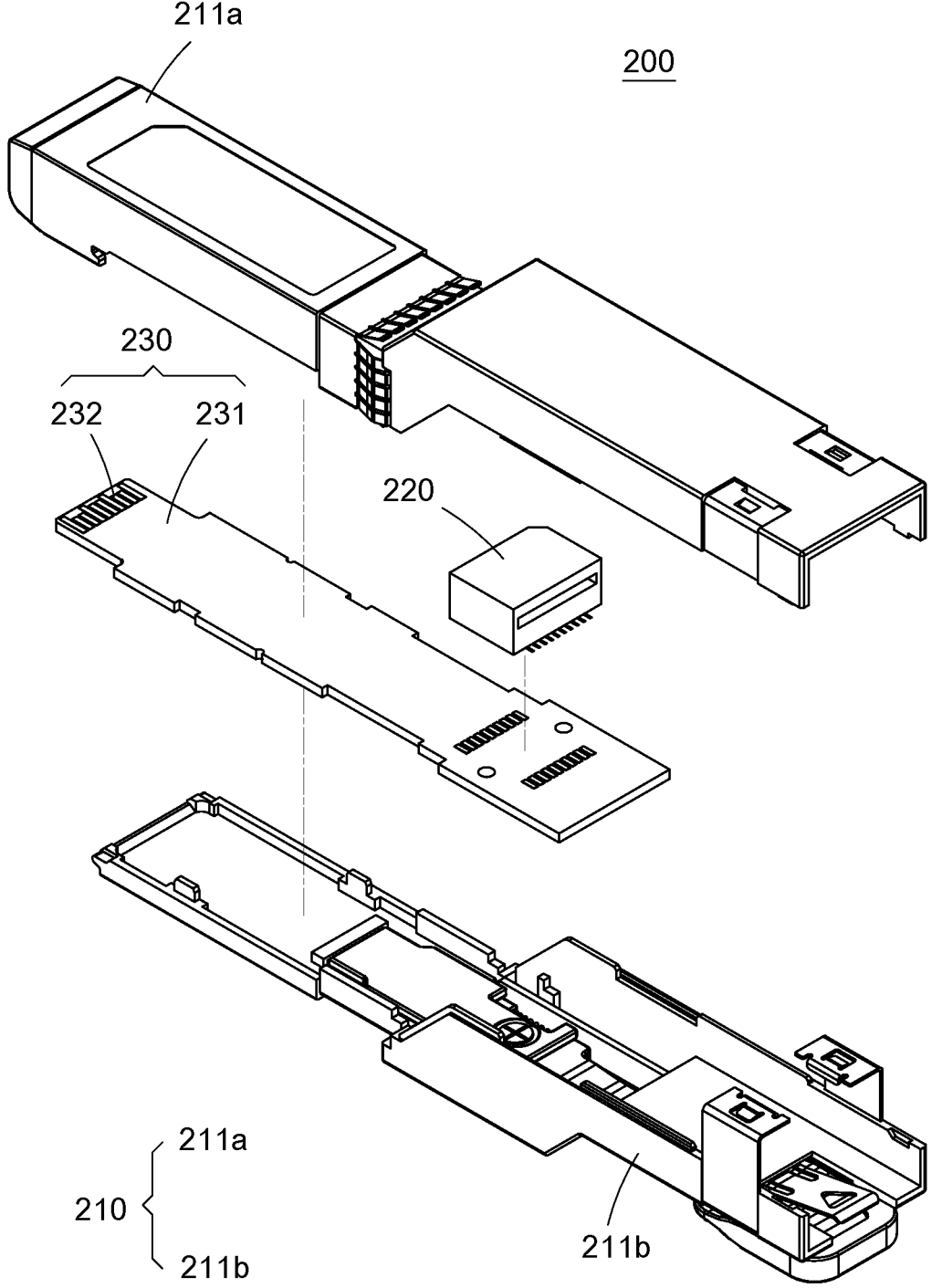
FIG. 2 is a perspective exploded view of an adapter module of the photoelectric signal conversion device according to one embodiment of the present disclosure.
Figure 3:
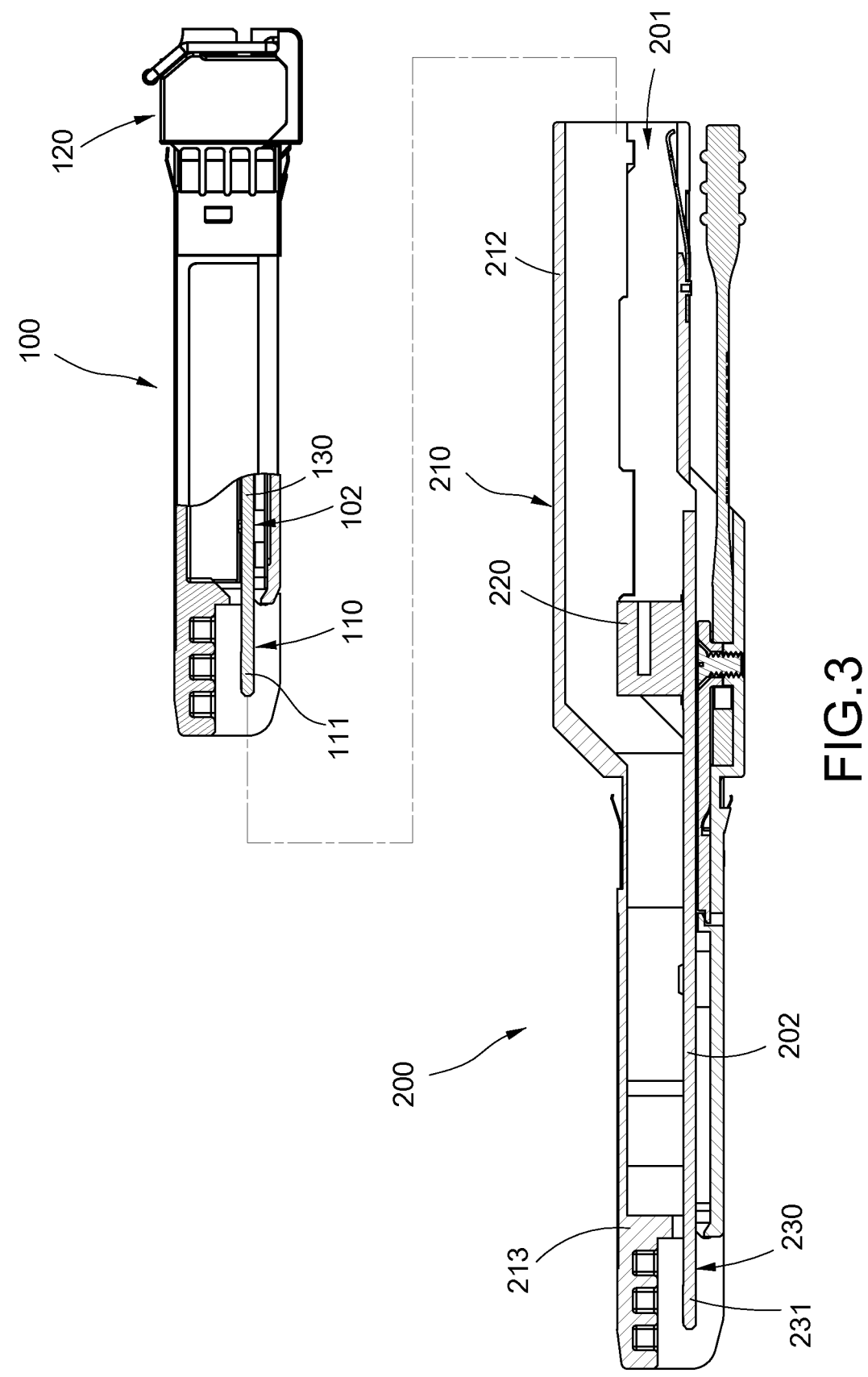
FIG. 3 is a cross-sectional view, taken along a longitudinal direction, illustrating the photoelectric signal conversion device in an exploded state according to one embodiment of the present disclosure.
Figure 4:
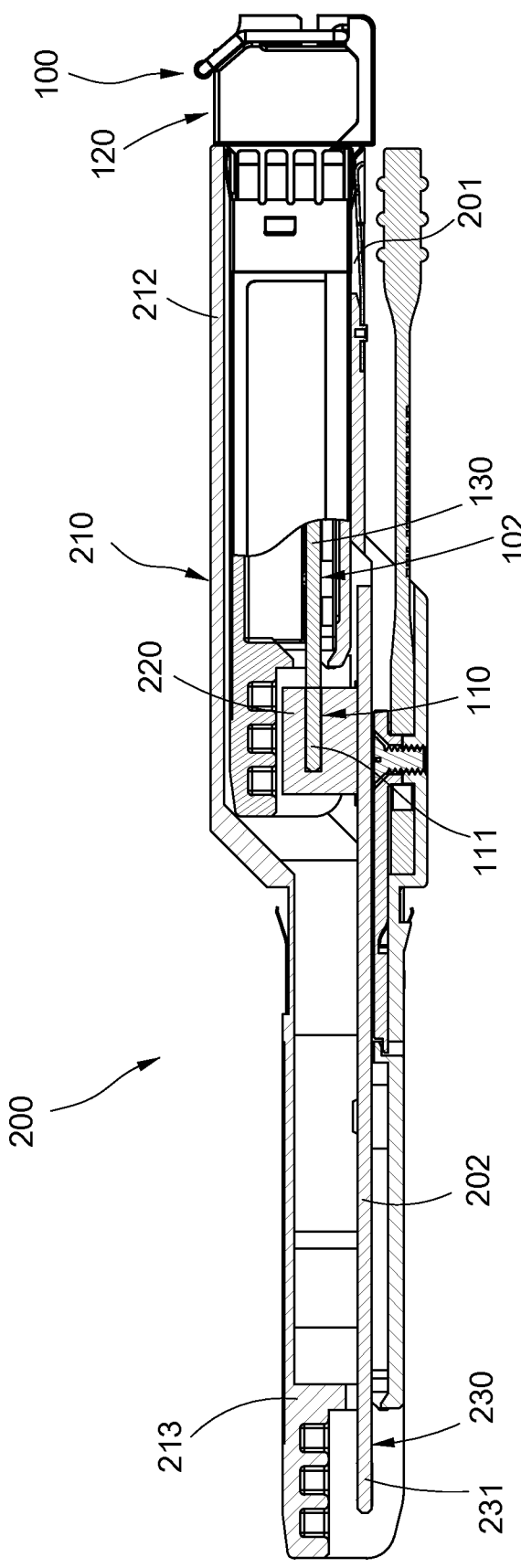
FIG. 4 is a cross-sectional view, taken along the longitudinal direction, illustrating the photoelectric signal conversion device according to one embodiment of the present disclosure.

Referring to FIG. 1, one embodiment of the present disclosure provides a photoelectric signal conversion device. The photoelectric signal conversion device at least includes an optical module 100 and an adapter module 200.

Referring to FIG. 1, the optical module 100 includes a first module housing 101, a first electrical connection structure 110, a photoelectric signal conversion component 102, and an optical signal connection structure 120. The first module housing 101 is an elongated hollow column. The first electrical connection structure 110, the photoelectric signal conversion component 102, and the optical signal connection structure 120 are accommodated in the first module housing 101. The first electrical connection structure 110 and the optical signal connection structure 120 are connected to the photoelectric signal conversion component 102. In the present embodiment, the photoelectric signal conversion component 102 includes a signal conversion circuit board 130. The first electrical connection structure 110 and the photoelectric signal conversion component 102 are disposed on the signal conversion circuit board 130. Specifically, the first electrical connection structure 110 includes a first tongue 111 extended from the signal conversion circuit board 130 and a plurality of first conductive points 112 disposed on a surface of the first tongue 111.

Referring to FIGS. 1 to 4, the adapter module 200 includes a second module housing 210, an insertion slot 201, an adapter circuit board 202, a second electrical connection structure 220, and a third electrical connection structure 230. The second module housing 210 is an elongated hollow column, and may be composed of two half shells 211a, 211b seamlessly connected to each other. The second module housing 210 includes a second coupling end 212 and a third coupling end 213 disposed opposite to the second coupling end 212. The insertion slot 201 is formed in the second coupling end 212 of the second module housing 210, and a shape of the first module housing 101 matches a shape of the insertion slot 201, so that the optical module 100 may be inserted in the insertion slot 201. The adapter circuit board 202 is accommodated in the third coupling end 213 and extends to the second coupling end 212. The second electrical connection structure 220 and the third electrical connection structure 230 are disposed on the adapter circuit board 202. In the present embodiment, the second electrical connection structure 220 is a socket arranged on one side of the adapter circuit board 202. The second electrical connection structure 220 is arranged in the insertion slot 201 and electrically connected to the third electrical connection structure 230 through the adapter circuit board 202. When the optical module 100 is inserted in the insertion slot 201, the first electrical connection structure 110 of the optical module 100 is coupled to the second electrical connection structure 220, so that the photoelectric signal conversion component 102 is electrically connected to the third electrical connection structure 230 through the first electrical connection structure 110, the second electrical connection structure 220, and the adapter circuit board 202. The third electrical connection structure 230 is exposed from the second module housing 210. The third electrical connection structure 230 is in the same configuration as the first electrical connection structure 110. Specifically, the third electrical connection structure 230 includes a third tongue 231 and a plurality of third conductive points 232 arranged on a surface of the third tongue 231. The third tongue 231 has the same structure as the first tongue 111. The third conductive points 232 have the same layout as the first conductive points 112.

Figure 5:
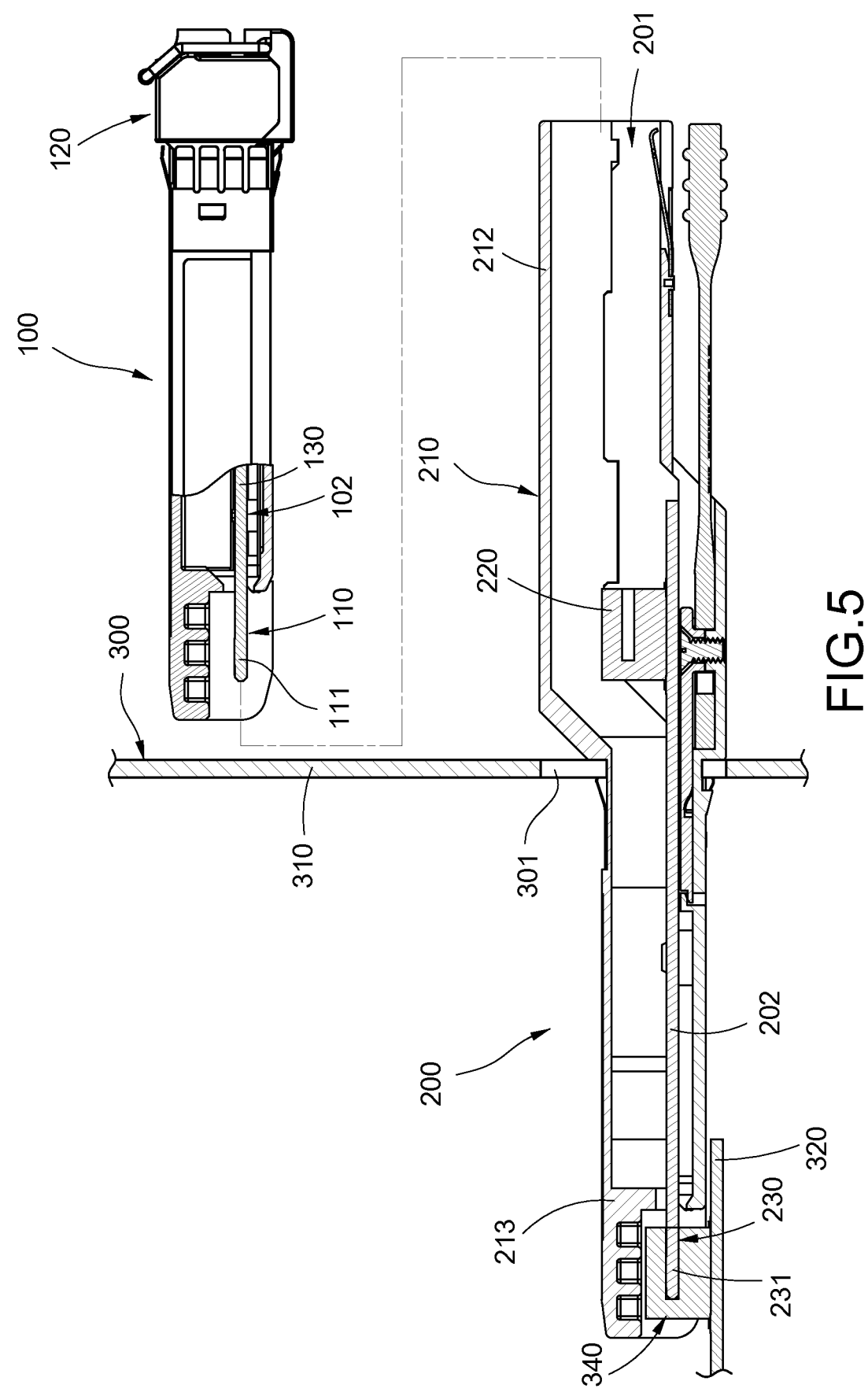
FIGS. 5 to 7 are schematic views illustrating in-use states of an electrical connection connector according to one embodiment of the present disclosure.
Figure 6:
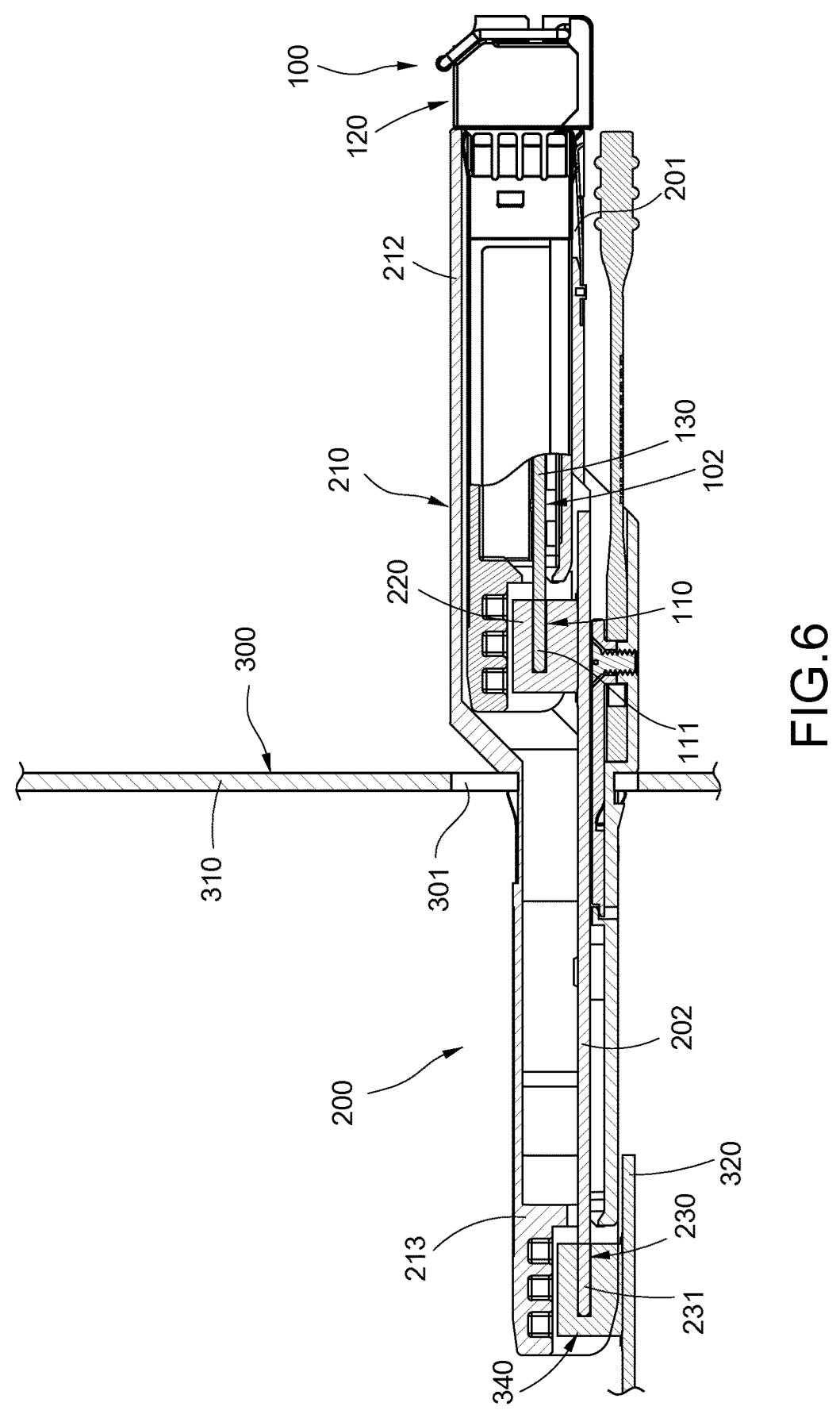

Referring to FIGS. 5 and 6, the photoelectric signal conversion device of the present embodiment also includes a host 300. The host 300 includes a host housing 310. An opening 301 is defined on the host housing 310. The host housing 310 is provided with a fourth electrical connection structure 340. A main circuit board 320 is disposed inside the host housing 310, and the fourth electrical connection structure 340 is disposed on the main circuit board 320.

When the photoelectric signal conversion device of the present embodiment is in use, the adapter module 200 is disposed in the host 300. Specifically, the third coupling end 213 of the second module housing 210 is inserted into the host housing 310 through the opening 301, so that the third electrical connection structure 230 is located in the host 300 and connected to the fourth electrical connection structure 340 of the host 300. The second coupling end 212 of the second module housing 210 is located outside the host housing 310, so that the insertion slot 201 is located outside the host 300. The second electrical connection structure 220 is disposed corresponding to the opening 301 and located outside the host housing 310.

The optical module 100 is inserted into the insertion slot 201, so that the photoelectric signal conversion component 102 is located outside the host 300. The first electrical connection structure 110 is coupled to the second electrical connection structure 220, so that the photoelectric signal conversion component 102 is electrically connected to the host 300. The photoelectric signal conversion component 102 is electrically connected to the main circuit board 320 through the first electrical connection structure 110, the second electrical connection structure 220, the third electrical connection structure 230, and the fourth electrical connection structure 340. The optical signal connection structure 120 is located outside the adapter module 200 for insertion of an optical signal line. Therefore, the optical module 100 is located outside the host 300 to facilitate heat dissipation of the photoelectric signal conversion component 102 inside the optical module 100.

Figure 7:
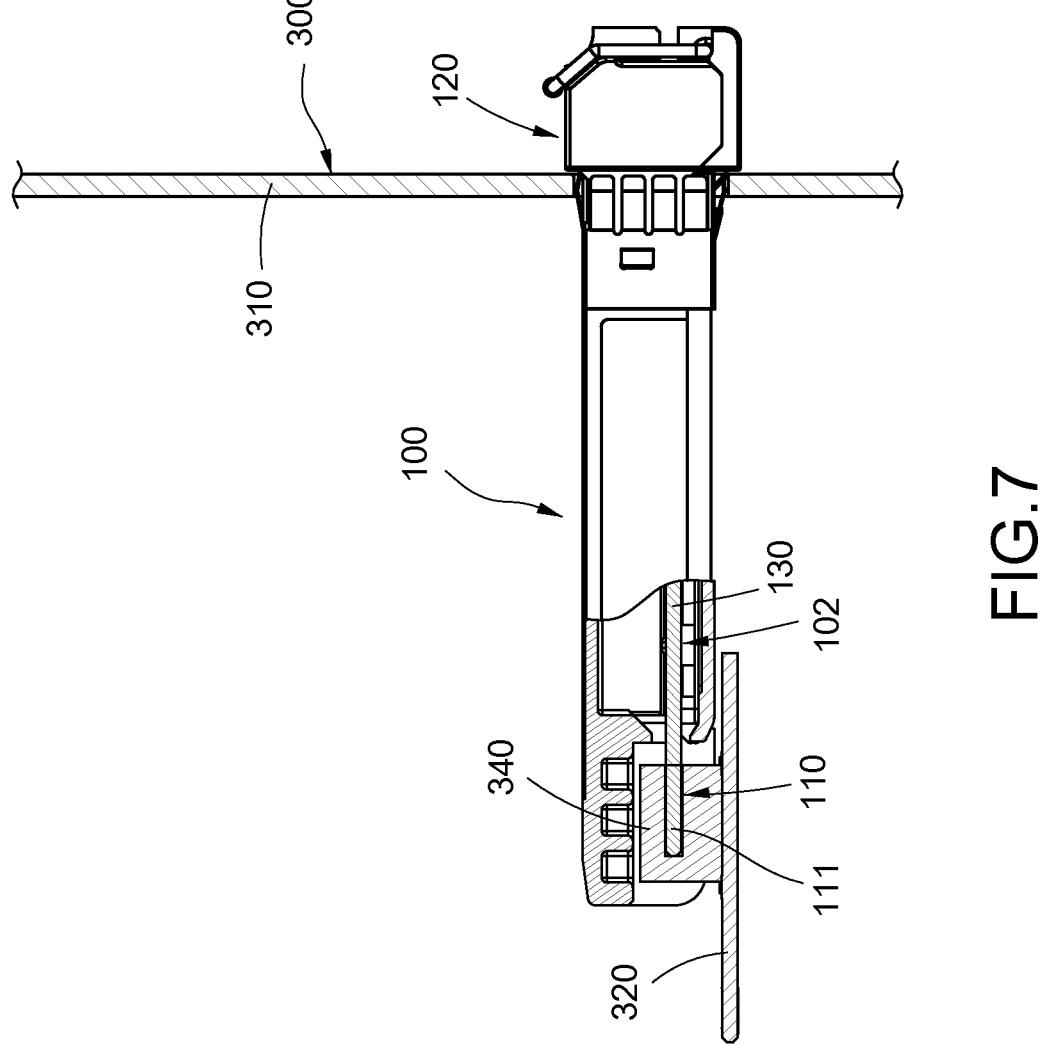

Referring to FIG. 7, the third electrical connection structure 230 is in the same configuration as the first electrical connection structure 110. Therefore, when the optical module 100 is directly inserted into the host 300, the first electrical connection structure 110 is also coupled to the fourth electrical connection structure 340. The photoelectric signal conversion component 102 is electrically connected to the main circuit board 320 through the first electrical connection structure 110 and the fourth electrical connection structure 340, and the optical signal connection structure 120 is exposed from the opening of the host housing 310 for coupling/connection.

Figure 8:
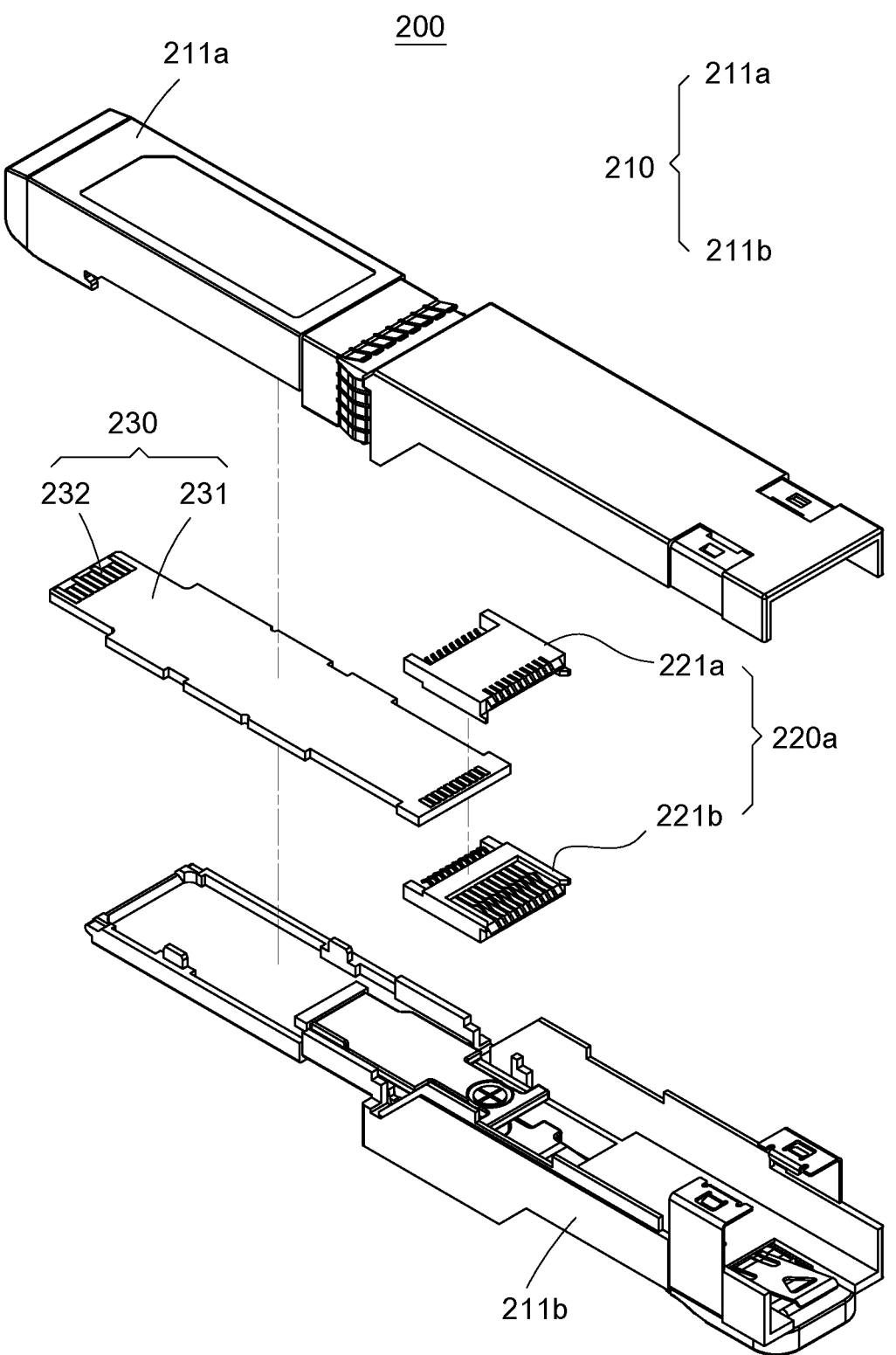
FIG. 8 is a perspective exploded view illustrating the photoelectric signal conversion device according to another embodiment of the present disclosure.

Referring to FIG. 8, another embodiment of the present disclosure provides another photoelectric signal conversion device having a structure similar to the structure of the foregoing embodiment. A difference between the present embodiment and the foregoing embodiment is described in detail below. In the present embodiment, the second electrical connection structure 220a includes two terminal blocks 221a, 222a. The terminal blocks 221a, 222a are respectively arranged on two sides of the adapter circuit board 202, the two terminal blocks 221a, 222a protrude from an edge of the adapter circuit board 202, and the first electrical connection structure 110 is inserted between the two terminal blocks 221a, 222a.

Figure 9:
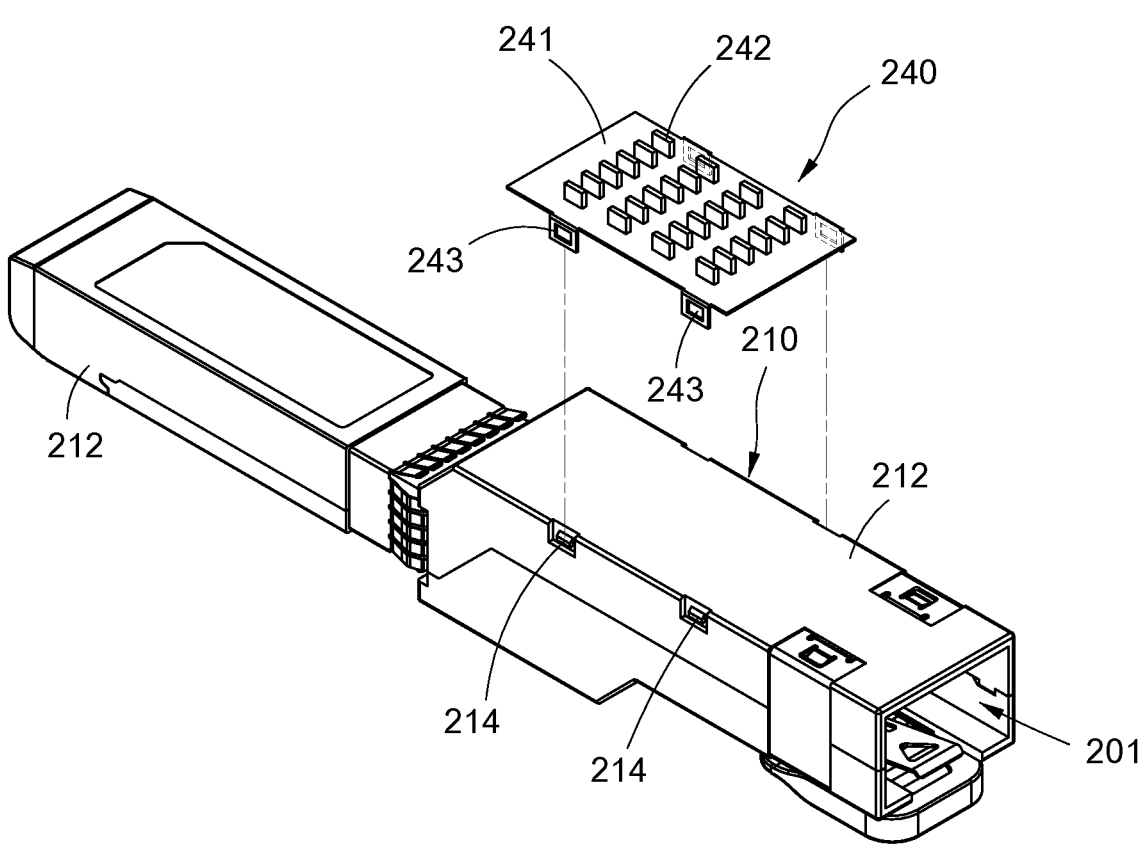
FIG. 9 is a perspective exploded view illustrating the photoelectric signal conversion device according to still another embodiment of the present disclosure.

Referring to FIG. 9, another embodiment of the present disclosure provides yet another photoelectric signal conversion device having a structure similar to the structures of the foregoing embodiments. A difference between the present embodiment and the foregoing embodiments is described in detail below. In the present embodiment, a heat dissipation component 240 is attached to an outer surface of the second coupling end 212 of the second module housing 210 to assist the photoelectric signal conversion component 102 to dissipate heat. The heat dissipation component 240 includes a substrate 241, and a plurality of fins 242 are disposed vertically (erected) on one side of the substrate 241. The substrate 241 is provided with a fastener 243, and the second coupling end 212 of the second module housing 210 is provided with a fastening structure 214 correspondingly. The substrate 241 is fixed on the second coupling end 212 by fastening the fastening structure 214 to the fastener 243, and another side of the substrate 241 is attached to an outer surface of the second coupling end 212. When the photoelectric signal conversion component 102 inside the second coupling end 212 generates heat during operation, the substrate 241 may absorb the heat generated by the photoelectric signal conversion component 102 and dissipate the heat to the ambient air through the fins 242.

In the photoelectric signal conversion device of the present disclosure, the optical module 100 is electrically connected to the host 300 through the adapter module 200, so that the optical module 100 is located outside the host 300 to facilitate the heat dissipation of the photoelectric signal conversion component 102 in the optical module 100.

The above descriptions are only some embodiments of the present disclosure, and are not intended to limit the protection scope of the present disclosure. Equivalent changes based on the spirit of the present disclosure should be deemed to fall within the protection scope of the present disclosure.

What is claimed is:

1. A photoelectric signal conversion device, comprising:
an optical module (100), comprising a first electrical connection structure (110), a photoelectric signal conversion component (102), and an optical signal connection structure (120), wherein the first electrical connection structure (110) and the optical signal connection structure (120) are connected to the photoelectric signal conversion component (102);
an adapter module (200), comprising an insertion slot (201), a second electrical connection structure (220/220a), and a third electrical connection structure (230), wherein the second electrical connection structure (220/220a) is disposed in the insertion slot (201) and electrically connected to the third electrical connection structure (230), and a configuration of the third electrical connection structure (230) is the same as a configuration of the first electrical connection structure (110), wherein the adapter module (200) comprises an adapter circuit board (202), and the second electrical connection structure (220/220a) and the third electrical connection structure (230) are connected to the adapter circuit board (202); wherein the adapter module (200) comprises a second module housing (210), the second module housing (210) comprises a second coupling end (212) and a third coupling end (213) disposed opposite to the second coupling end (212); and
a host (300), the adapter module (200) disposed therein, wherein the third electrical connection structure (230) is located inside and connected to the host (300), the second electrical connection structure (220/220a) is located outside the host (300) and the insertion slot (201) is located outside the host (300), wherein the host (300) comprises a host housing (310), an opening (301) is defined on the host housing (310), and the host (300) comprises a fourth electrical connection structure (340), the adapter module (200) is inserted in the host housing (310) through the opening (301), the third electrical connection structure (230) is coupled to the fourth electrical connection structure (340), the insertion slot (201) is located outside the host housing (310), and the second coupling end (212) is located outside the host housing (310);
wherein the second electrical connection structure (220/220a) and the third electrical connection structure (230) are disposed at two ends of the adapter circuit board (202) to be separated from each other and respectively accommodated in the second coupling end (212) and the third coupling end (213), the second coupling end (212) is located outside the host housing (310) and the third coupling end (213) is located inside the host housing (310);
wherein the optical module (100) is completely located outside the host (300) when the optical module (100) is inserted in the insertion slot (201), and the first electrical connection structure (110) is coupled to the second electrical connection structure (220/220a) to make the photoelectric signal conversion component (102) be electrically connected to the host (300).

2. The photoelectric signal conversion device according to claim 1, wherein the photoelectric signal conversion component (102) of the optical module (100) comprises a signal conversion circuit board (130), and the first electrical connection structure (110) and the optical signal connection structure (120) are arranged on the signal conversion circuit board (130).

3. The photoelectric signal conversion device according to claim 2, wherein the first electrical connection structure (110) comprises a first tongue (111) extended from the signal conversion circuit board (130) and a plurality of first conductive points (112) disposed on a surface of the first tongue (111).

4. The photoelectric signal conversion device according to claim 3, wherein the adapter module (200) comprises an adapter circuit board (202), and the second electrical connection structure (220/220a) and the third electrical connection structure (230) are connected to the adapter circuit board (202), the third electrical connection structure (230) comprises a third tongue (231) extended from the adapter circuit board (202) and a plurality of third conductive points (232) disposed on a surface of the third tongue (231), a structure of the third tongue (231) is the same as a structure of the first tongue (111), and a layout of the third conductive points (232) is same as a layout of the conductive points (112).

5. The photoelectric signal conversion device according to claim 1, wherein the second electrical connection structure (220a) comprises two terminal blocks (221a, 222a), the two terminal blocks (221*a*, 222*a*) are arranged on two sides of the adapter circuit board (202) and disposed protrusively from an edge of the adapter circuit board (202), and the first electrical connection structure (110) is inserted between the two terminal blocks (221*a*, 222*a*).

6. The photoelectric signal conversion device according to claim 1, wherein the optical signal connection structure (120) is located outside the adapter module (200).

7. The photoelectric signal conversion device according to claim 1, wherein the optical module (100) comprises a first module housing (101), a shape of the first module housing (101) matches a shape of the insertion slot (201) and the insertion slot (201) is defined in the second coupling end (212) of the second module housing (210).

8. The photoelectric signal conversion device according to claim 7, wherein a heat dissipation component (240) is attached to an outer surface of the second coupling end (212) of the second module housing (210).

\* \* \* \* \*